United States Patent
Shao et al.

(10) Patent No.: US 10,032,520 B2
(45) Date of Patent: Jul. 24, 2018

(54) POWER SYSTEM WITH DETECTING FUNCTION

(71) Applicant: eMemory Technology Inc., Hsin-Chu (TW)

(72) Inventors: Chi-Yi Shao, Hsinchu County (TW); Po-Hao Huang, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 88 days.

(21) Appl. No.: 15/237,610

(22) Filed: Aug. 15, 2016

(65) Prior Publication Data

US 2017/0054300 A1    Feb. 23, 2017

Related U.S. Application Data

(60) Provisional application No. 62/206,828, filed on Aug. 18, 2015.

(51) Int. Cl.
*H02J 1/00* (2006.01)
*H02J 4/00* (2006.01)
*G11C 17/16* (2006.01)
*G11C 17/18* (2006.01)

(52) U.S. Cl.
CPC ............. *G11C 17/16* (2013.01); *G11C 17/18* (2013.01); *H02J 1/00* (2013.01); *H02J 4/00* (2013.01)

(58) Field of Classification Search
CPC . G11C 17/16; G11C 17/18; H02J 4/00; Y10T 307/50; Y10T 307/549
USPC ...................................................... 307/43, 52
See application file for complete search history.

(56) References Cited

U.S. PATENT DOCUMENTS 9,197,136 B2    11/2015    Fang

FOREIGN PATENT DOCUMENTS

| CN | 201197117 Y | 2/2009 |
|---|---|---|
| CN | 202094808 U | 12/2011 |
| TW | 571517 | 1/2004 |
| TW | I505619 B | 10/2015 |

*Primary Examiner* — Hal Kaplan
(74) *Attorney, Agent, or Firm* — Winston Hsu

(57) ABSTRACT

A power system with detecting function includes a power source, a power level detector, and a power floating detector. The power source includes multiple voltage sources for operations in multiple voltage domains, respectively. The power level detector is configured to constantly monitor the voltage level of each voltage domain. The power floating detector is configured to detect the presence of floating voltages in each voltage domain. Therefore, the present power system with detection function can guarantee stable operations and detect glitch attacks.

13 Claims, 6 Drawing Sheets

POWER SYSTEM WITH DETECTING FUNCTION

CROSS REFERENCE TO RELATED APPLICATIONS

This application claims the benefit of U.S. provisional application No. 62/206,828 filed on Aug. 18, 2015.

BACKGROUND OF THE INVENTION

1. Field of the Invention

The preset invention is related to a power system with detecting function, and more particularly, to a power system with detecting function so as to guarantee stable operations or to detect glitch attacks.

2. Description of the Prior Art

In many integrated electronic circuits, multiple different voltage power supply levels are provided for different circuit portions, such as core logic, analog circuits and input output interfaces, and any other suitable circuits. Each circuit portion may have different power levels, high drive voltage levels, and maximum allowable voltage levels, depending on the type of transistor technology and design used at each circuit portion. For example, a modern microprocessor chip may include core logic that operates in one voltage domain while interacting with input/output (I/O) circuitry operating in another. Each voltage domain has a corresponding nominal operational range for stable operation of associated circuit portions.

When an integrated electronic circuit is used for implementing a secure system, many security checks may be introduced to prevent unauthorized access to and/or manipulation of data stored in the system. A glitch attack refers to a transient disturbance introduced onto one or more signals or voltage lines in the system in order to force hardware into an illegitimate state, thereby bypassing security features or cause processors to jump around key instructions.

In order for all circuit portions of an integrated electronic circuit to function stably or to detect a glitch attack, a voltage detector is adopted for constantly monitoring the voltage level of each voltage domain. This way, when a voltage domain somehow exceeds its nominal operational range, a circuit block may be trigger to restart operation or reset the power source. Therefore, there is a need for a power system with detection function so as to guarantee stable operations or to detect glitch attacks.

SUMMARY OF THE INVENTION

The present invention provides a power system with detecting function and including a power source, a power level detector, a power floating detector, and a controller. The power source includes a first voltage source for operations in a first voltage domain of the power system and a second voltage source for operations in a second voltage domain of the power system. The power level detector includes a first voltage level detector configured to determine whether a voltage supplied by the second voltage source is within a second nominal operational range associated with the second voltage domain. The power floating detector includes a first voltage floating detector configured to determine whether the voltage supplied by the first voltage source is floating, and a second floating level detector configured to determine whether the voltage supplied by the second voltage source is floating. The controller is configured to output a power status signal according to a level signal and a floating signal. The power status signal is at a first level when the voltage supplied by the first voltage source exceeds the first nominal operational range, when the voltage supplied by the second voltage source exceeds the second nominal operational range, when the voltage supplied by the first voltage source is floating, or when the voltage supplied by the second voltage source is floating. The power status signal is at a second level when the voltage supplied by the first voltage source is within the first nominal operational range, when the voltage supplied by the second voltage source is within the second nominal operational range, when the voltage supplied by the first voltage source is not floating, and when the voltage supplied by the second voltage source is not floating.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
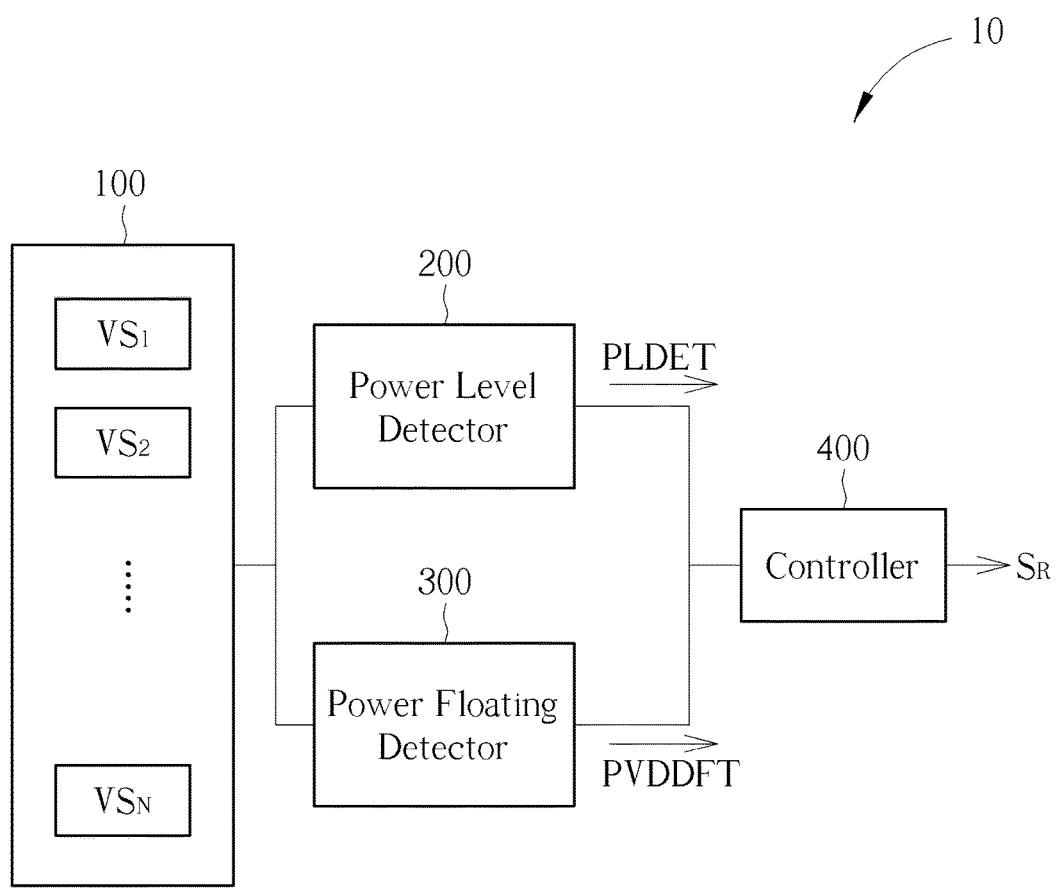
FIG. 1 is a functional diagram illustrating a power system with detection function according to an embodiment of the present application.

FIG. 1 is a functional diagram illustrating a power system 10 with detection function according to an embodiment of the present application. The power system 10 includes a power source 100, a power level detector 200, a power floating detector 300, and a controller 400.

In the present invention, the power source 100 may include multiple voltage sources $VS_1 \sim VS_N$ (N is an integer larger than 1) for operations in multiple voltage domains VDD1~VDDN in the power system 10. In an embodiment, each of the voltage sources $VS_1 \sim VS_N$ may be implemented as independent circuitry. In another embodiment, at least one of the voltage sources $VS_1 \sim VS_N$ is implemented as an independent circuitry whose output may thus be converted to the required voltage level of another voltage domain by another voltage source which includes a voltage converter. However, the number of the voltage domains in the power system 10 and the implementation of the power source 100 do not limit the scope of the present application.

The power level detector 200 is configured to monitor the level of each voltage source in the power source 100, thereby outputting a corresponding level signal PLDET. The power floating detector 300 is configured to detect floating voltages in the N voltage domains associated with the voltage sources $VS_1 \sim VS_N$, thereby outputting a corresponding floating signal PVDDFT. The controller 400 is configured to output a power status signal $S_R$ according to the level signal PLDET and the floating signal PVDDFT. The operations of the power level detector 200, the power floating detector 300 and the controller 400 will be described in detail in subsequent paragraphs.

Figure 2:
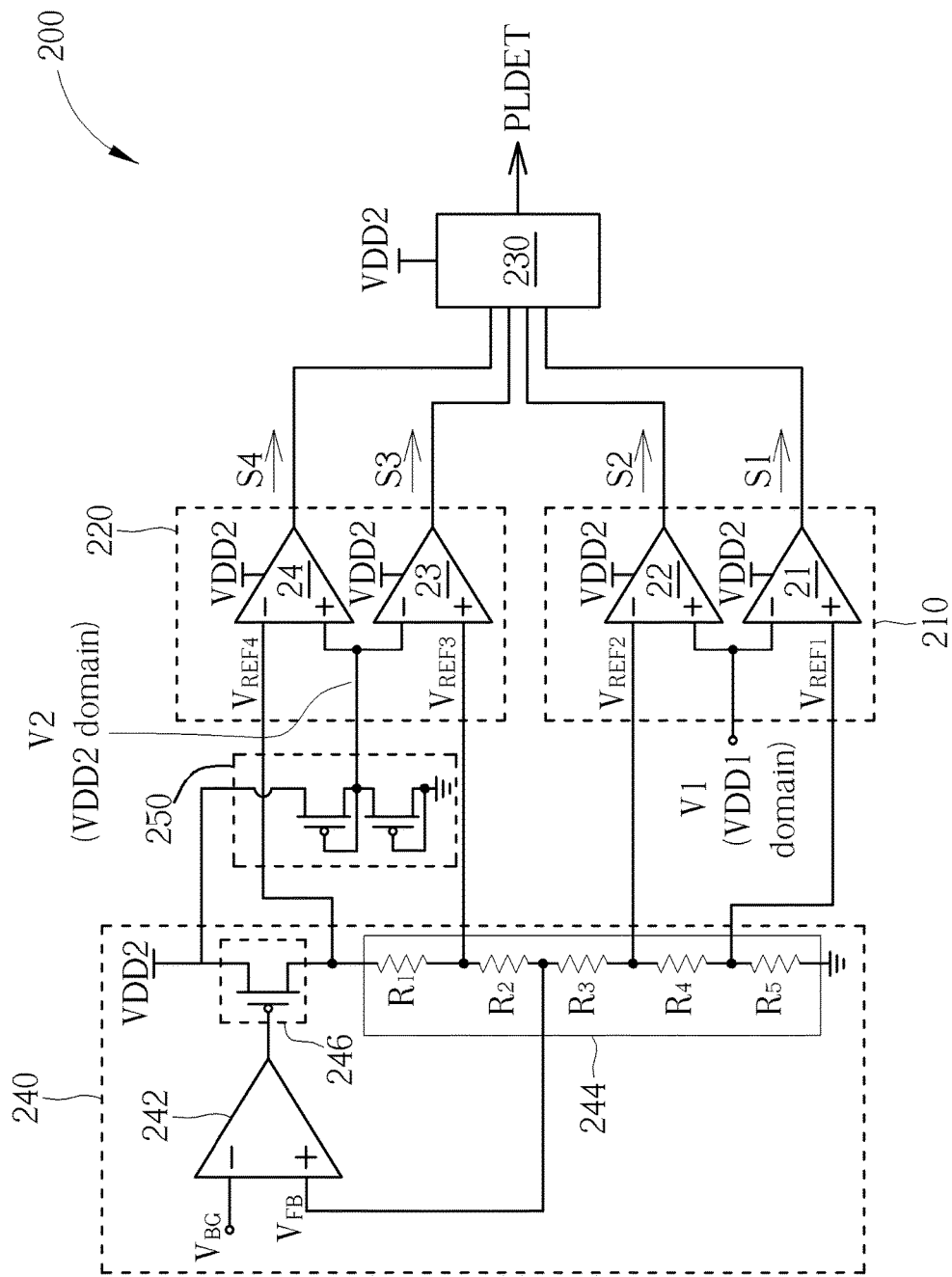
FIG. 2 is a diagram illustrating a circuitry for implementing a power level detector according to an embodiment of the present invention.

FIG. 2 is a diagram illustrating a circuitry for implementing the power level detector 200 according to an embodiment of the present invention. In the present invention, the power level detector 200 may include a reference voltage generator, a voltage converter, a logic circuit and N voltage level detectors. For illustrative purpose, FIG. 2 depicts the embodiment of N=2 in which the power level detector 200 includes a first voltage level detector 210, a second voltage level detector 220, a logic circuit 230, a reference voltage generator 240, and a voltage converter. In other words, there are two voltage domains in FIG. 2 wherein the voltage domain VDD1 is supplied by the voltage source $VS_1$ depicted in FIG. 1 and the voltage domain VDD2 is supplied by the voltage source $VS_2$ depicted in FIG. 1. However, the number of voltage domains does not limit the scope of the present application.

In the present invention, the reference voltage generator 240 is configured to generate a plurality of reference voltages $V_{REF1} \sim V_{REFM}$ (M=2N) for the multiple voltage domains in the power system 10. The reference voltage generator 240 may be implemented as a low-dropout (LDO) circuit which includes a comparator 242, a voltage-dividing circuit 244, and a transistor 246. The voltage-dividing circuit 244 may include a plurality of resistors $R_1 \sim R_5$ coupled in series for converting the output current of the transistor 246 into the plurality of reference voltages $V_{REF1} \sim V_{REFM}$. The comparator 242 is configured to output a gate control signal according to the difference between a bandgap voltage $V_{BG}$ and a feedback voltage $V_{FB}$ associated with the output current of the transistor 246. If the feedback voltage $V_{FB}$ is lower than the bandgap voltage $V_{BG}$, the gate of the transistor 246 is pulled lower, allowing more current to pass and increasing the reference voltages $V_{REF1} \sim V_{REFM}$. If the feedback voltage $V_{FB}$ is higher than the bandgap voltage $V_{BG}$, the gate of the transistor 246 is pulled higher, restricting the current flow and decreasing the reference voltages $V_{REF1} \sim V_{REFM}$. However, the implementation of the reference voltage generator 240 does not limit the scope of the present application.

In the present invention, the value and the number of the resistors in the reference voltage generator 240 are associated with the number of voltage domains in the power system 10 and the nominal operational range of each voltage domain. For illustrating purpose as previously stated, FIG. 2 depicts the embodiment when the power system 10 includes two voltage domains VDD1 and VDD2 (N=2 and M=4), wherein VDD2 is higher than VDD1. Under such circumstances, the value of the resistors $R_1 \sim R_5$ are selected so that $V_{REF4} > V_{REF3} > V_{REF2} > V_{REF1}$. More specifically, the reference voltages $V_{REF4}$ is used to determine whether the power supplied in the voltage domain VDD2 rises above the upper limit of the nominal operational range of the voltage domain VDD2, the reference voltages $V_{REF3}$ is used to determine whether the power supplied in the voltage domain VDD2 drops below the lower limit of the nominal operational range of the voltage domain VDD2, the reference voltages $V_{REF2}$ is used to determine whether the power supplied in the voltage domain VDD1 rises above the upper limit of the nominal operational range of the voltage domain VDD1, and the reference voltages $V_{REF1}$ is used to determine whether the power supplied in the voltage domain VDD1 drops below the lower limit of the nominal operational range of the voltage domain VDD1. However, the value and the number of the resistors in the reference voltage generator 240 do not limit the scope of the present application.

In the present invention, the structure of each voltage level detector is associated with the number of voltage domains in the power system 10. For illustrating purpose as previously stated, FIG. 2 depicts the embodiment when the power system 10 includes two voltage domains VDD1 and VDD2 (N=2 and M=4), wherein VDD2 is higher than VDD1. Under such circumstances, the first voltage level detector 210 includes two comparators 21 and 22, while the second voltage level detector 220 includes two comparators 23 and 24. The negative input end of the comparator 21 and the positive input end of the comparator 22 are both coupled to receive a voltage V1 associated with the voltage domain VDD1. The negative input end of the comparator 23 and the positive input end of the comparator 24 are both coupled to receive a voltage V2 associated with the voltage domain VDD2. The positive input end of the comparator 21, the negative input end of the comparator 22, the positive input end of the comparator 23, and the negative input end of the comparator 24 are coupled to receive the reference voltage $V_{REF1} \sim V_{REF4}$, respectively. The comparators 21-24 are configured to generate control signals S1~S4 and switch the level of the control signals S1~S4 according the voltages V1 and V2.

In the embodiment illustrated in FIG. 2, the comparator 21 is configured to generate a logic 1 control signal S1 when the voltage V1 associated with the voltage domain VDD1 does not exceed the reference voltage $V_{REF1}$ (i.e., the power supplied in the voltage domain VDD1 drops below its lower limit), and generate a logic 0 control signal S1 when the voltage V1 associated with the voltage domain VDD1 exceeds the reference voltage $V_{REF1}$ (i.e., the power supplied in the voltage domain VDD1 remains higher than its lower limit).

In the embodiment illustrated in FIG. 2, the comparator 22 is configured to generate a logic 1 control signal S2 when the voltage V1 associated with the voltage domain VDD1 exceeds the reference voltage $V_{REF2}$ (i.e., the power supplied in the voltage domain VDD1 rises above its upper limit), and generates a logic 0 control signal S2 when the voltage V1 associated with the voltage domain VDD1 does not exceed the reference voltage $V_{REF2}$ (i.e., the power supplied in the voltage domain VDD1 remains lower than its upper limit).

In the embodiment illustrated in FIG. 2, the comparator 23 is configured to generate a logic 1 control signal S3 when the voltage V2 associated with the voltage domain VDD2 does not exceed the reference voltage $V_{REF3}$ (i.e., the power supplied in the voltage domain VDD2 drops below its lower limit), and generate a logic 0 control signal S3 when the voltage V2 associated with the voltage domain VDD2 exceeds the reference voltage $V_{REF3}$ (i.e., the power supplied in the voltage domain VDD2 remains higher than its lower limit).

In the embodiment illustrated in FIG. 2, the comparator 24 is configured to generate a logic 1 control signal S4 when the voltage V2 associated with the voltage domain VDD2 exceeds the reference voltage $V_{REF4}$ (i.e., the power supplied in the voltage domain VDD2 rises above its upper limit), and generates a logic 0 control signal S4 when the voltage V2 associated with the voltage domain VDD2 does not exceed the reference voltage $V_{REF4}$ (i.e., the power supplied in the voltage domain VDD2 remains lower than its upper limit).

The logic circuit 230 is configured to generate the level signal PLDET and switch the level of the level signal PLDET according the control signals S1~S4. In an embodiment, the logic circuit 230 may be implemented using a 4-input NOR gate which is configured to generates a logic 1 level signal PLDET when all of the control signals S1~S4 are at logic 0 level and generate a logic 0 level signal PLDET when any of the control signals S1~S4 are at logic 1 level. In other words, a logic 1 level signal PLDET indicates that the power supplied in all voltage domains are within their nominal operational ranges, and a logic 0 level signal PLDET indicates that at least the power supplied in one voltage domain exceeds its nominal operational range. However, the implementation of the logic circuit 230 does not limit the scope of the present application.

In the embodiment depicted in FIG. 2, the reference voltage generator 240 and each of the comparators 21-24 operate in the voltage domain VDD2. The voltage converter 250 is configured to convert the voltage supplied by the voltage source $VS_2$ into the voltage V2, while the voltage V1 may be directly obtained from the voltage source $VS_1$. Thus, the second voltage level detector 220 can detect the level of the voltage V2 using the reference voltages $V_{REF3}$ and $V_{REF4}$ generated by voltage-dividing in the voltage domain VDD2. However, the method of obtaining the voltage associated with each voltage source does not limit the scope of the present application.

As previously stated for illustrating purpose, the power level detector 200 depicted in FIG. 2 includes two voltage domains VDD1 and VDD2, wherein both the first voltage level detector 210 and the second voltage level detector 220 operate in the voltage domain VDD2. In another embodiment, the power level detector 200 may include N voltage domains VDD1~VDDN (N>2), wherein multiple voltage converters and N voltage level detectors are adapted for detecting the level of voltages V1~VN associated with the N voltage domains VDD1~VDDN, respectively. The N voltage level detectors may operate in any of the N voltage domains VDD1~VDDN as long as each of the voltages V1~VN is within the suitable input range for proper operation of each voltage level detector, such as using a corresponding voltage converter. However, the operating voltage domain of the voltage level detector 200 does not limit the scope of the present invention.

As previously stated for illustrating purpose, the power level detector 200 depicted in FIG. 2 includes two voltage domains VDD1 and VDD2 wherein the logic circuit 230 may be implemented using a 4-input NOR gate configured to generate a level signal PLDET in the voltage domain VDD2. In another embodiment, the power level detector 200 may include N voltage domains VDD1~VDDN (N>2) wherein the logic circuit 230 is implemented using a 2N-input NOR gate. Also, the level signal PLDET may be in the voltage domain VDD1 which is typically the core power of the power system 10. However, the structure of the logic circuit 230 does not limit the scope of the present invention.

Figure 3:
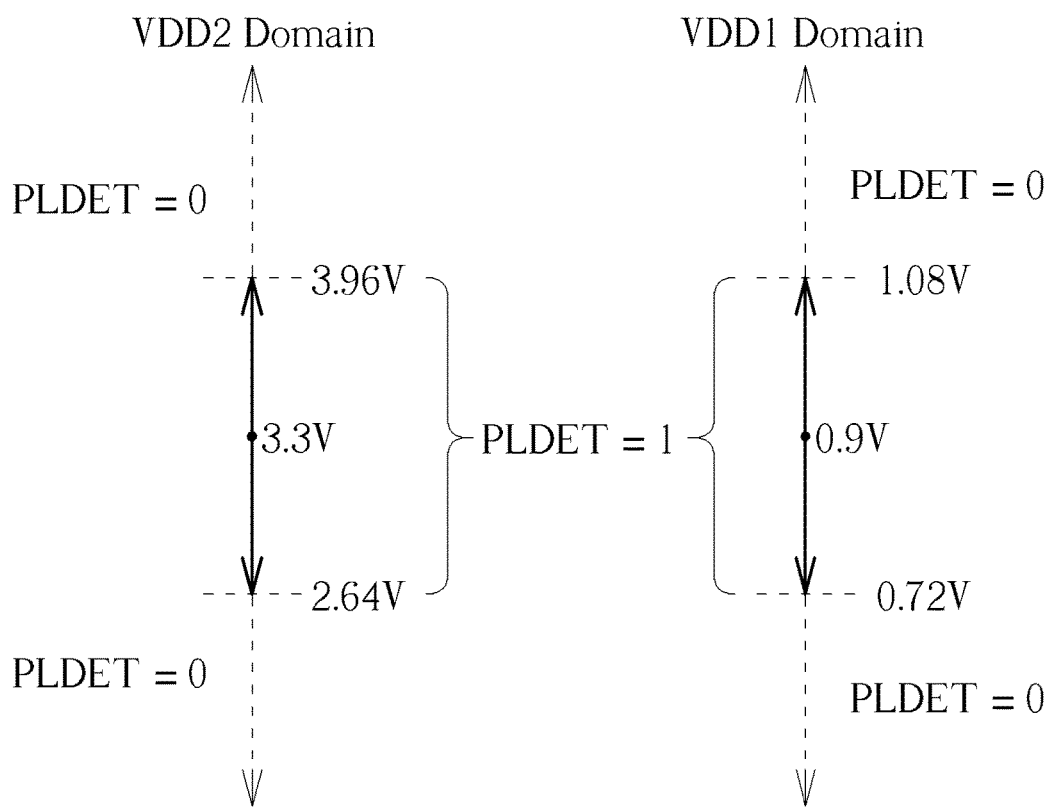
FIG. 3 is a diagram illustrating the operation of a power level detector according to an embodiment of the present invention.

FIG. 3 is a diagram illustrating the operation of the power level detector 200 according to an embodiment of the present invention. The value of the resistors $R_1$~$R_5$ in the reference voltage generator 240 may be selected so that $V_{REF1}$ is equal to (1−A %)*V1, $V_{REF2}$ is equal to (1+B %)*V1, $V_{REF3}$ is equal to (1−C %)*V2, and $V_{REF4}$ is equal to (1+D %)*V2, wherein A, B, C, D are positive numbers smaller than 100. For illustrative purpose, it is assumed that the typical supply voltage of the voltage domain VDD1 is 0.9V, the typical supply voltage of the voltage domain VDD2 is 3.3V, the conversion ratio of the voltage converter 250 is 0.5 and A=B=C=D=20. That is, V1=0.9V, V2=1.65V, $V_{REF1}$=0.72V, $V_{REF2}$=1.08V, $V_{REF3}$=1.32V, and $V_{REF2}$=1.98V. Therefore, as long as the power supplied in the voltage domain VDD1 remains within its nominal operational range defined by an upper limit ($V_{REF2}$) and a lower limit ($V_{REF1}$) and the power supplied in the voltage domain VDD2 remains within its nominal operational range defined by an upper limit (2*$V_{REF4}$) and a lower limit (2*$V_{REF3}$), the logic circuit 230 is configured to generate a logic 1 level signal PLDET. If the power supplied in any of the voltage domains VDD1 and VDD2 exceeds its nominal operational range, the logic circuit 230 is configured to generate a logic 0 level signal PLDET.

Figure 4:
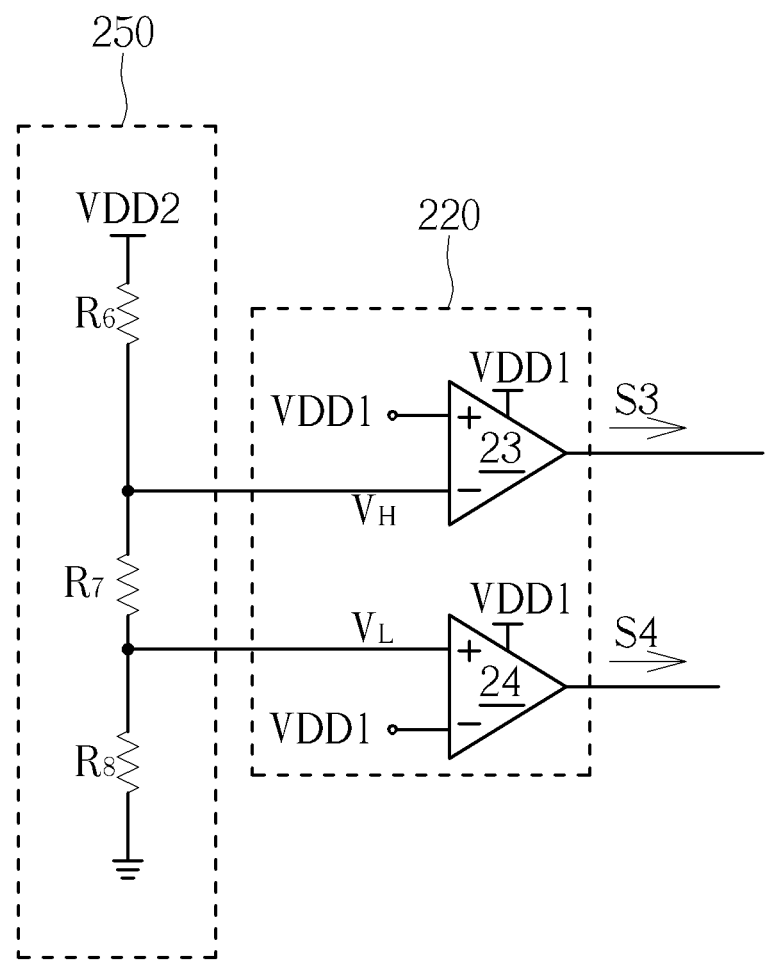
FIG. 4 is a diagram illustrating a circuitry for implementing a second voltage level detector and a voltage converter of a power level detector according to another embodiment of the present invention.

FIG. 4 is a diagram illustrating a circuitry for implementing the second voltage level detector 220 and the voltage converter 250 of the power level detector 200 according to another embodiment of the present invention. In the embodiment depicted in FIG. 4, the second voltage level detector 220 operates in the voltage domain VDD1, while the voltage converter 250 operates in the voltage domain VDD2. The voltage converter 250 is implemented as a voltage-dividing circuit which includes a plurality of resistors $R_6$~$R_8$ coupled in series for converting the voltage supplied in the voltage domain VDD2 into a voltage VH and a voltage VL whose values are within the suitable input range for proper operation of the second voltage level detector 220.

The second voltage level detector 220 includes two comparators 23 and 24. The negative input end of the comparator 24 and the positive input end of the comparator 23 are both coupled to receive the voltage supplied in the voltage domain VDD1. The negative input end of the comparator 23 is coupled to receive the voltage VH associated with the voltage domain VDD2. The positive input end of the comparator 24 is coupled to receive the voltage VL associated with the voltage domain VDD2. The comparators 23-24 are configured to generate control signals S3~S4 and switch the level of the control signals S3~S4 according the voltages VDD1, VL and VH.

In the embodiment illustrated in FIG. 4, the comparator 23 is configured to generate a logic 0 control signal S3 when the voltage VH associated with the voltage domain VDD2 exceeds the voltage supplied in the voltage domain VDD1 (i.e., the power supplied in the voltage domain VDD2 remains higher than its lower limit), and generate a logic 1 control signal S3 when the voltage VH associated with the voltage domain VDD2 does not exceed the voltage supplied in the voltage domain VDD1 (i.e., the power supplied in the voltage domain VDD2 drops below its lower limit). The comparator 24 is configured to generate a logic 0 control signal S4 when the voltage VL associated with the voltage domain VDD2 does not exceed the voltage supplied in the voltage domain VDD1 (i.e., the power supplied in the voltage domain VDD2 remains lower than its upper limit), and generate a logic 1 control signal S4 when the voltage VL associated with the voltage domain VDD2 exceeds the voltage supplied in the voltage domain VDD1 (i.e., the power supplied in the voltage domain VDD2 rises above its upper limit).

Figure 5:
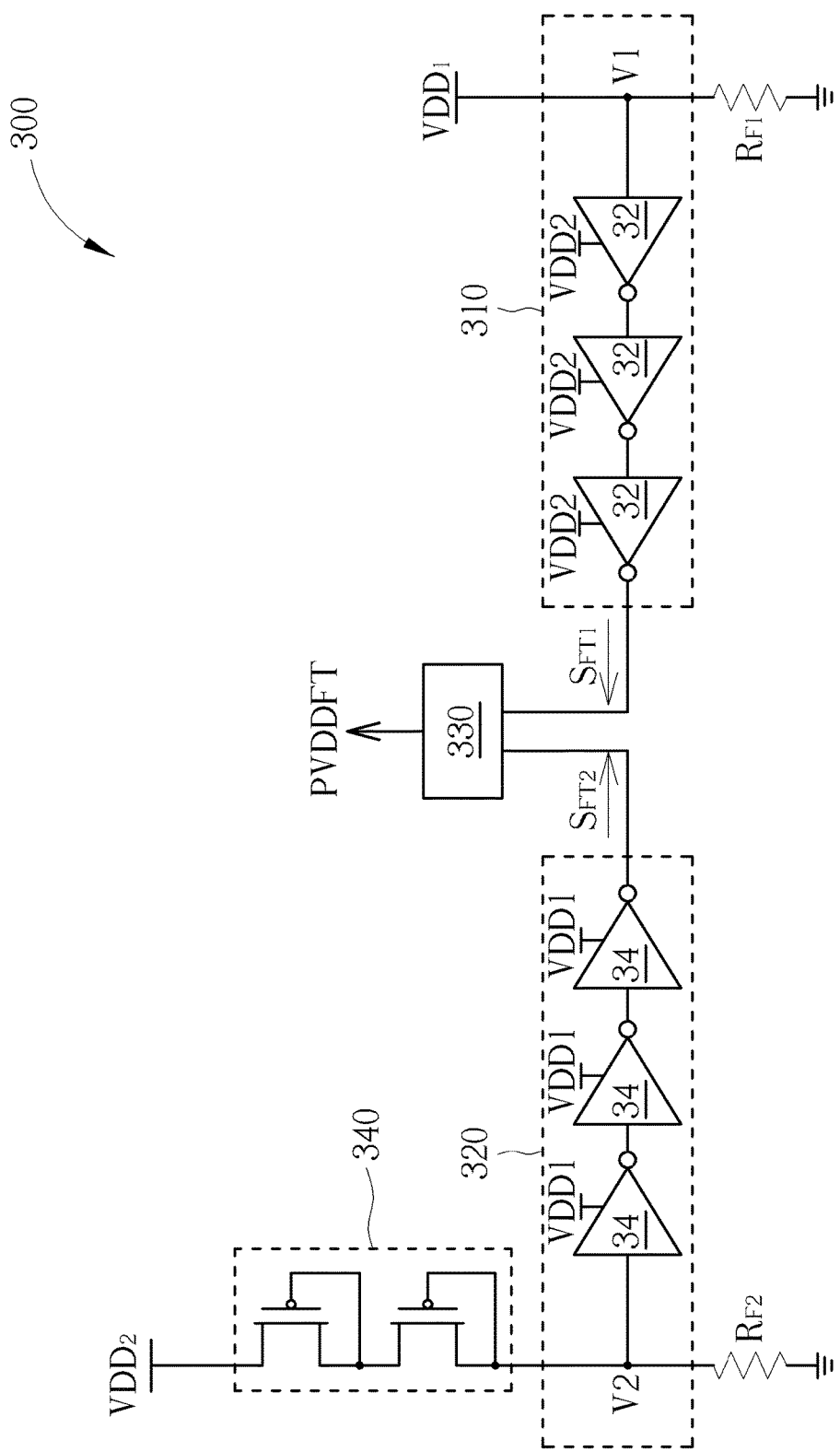
FIG. 5 is a diagram illustrating a circuitry for implementing a power floating detector according to an embodiment of the present invention.

FIG. 5 is a diagram illustrating a circuitry for implementing the power floating detector 300 according to an embodiment of the present invention. In the present invention, the power floating detector 300 may include a logic circuit 330 and N voltage floating detectors configured to detect floating voltages in the N voltage domains of the power system 10, respectively. For illustrative purpose, FIG. 5 depicts the embodiment of N=2 in which the power floating detector 300 includes a first voltage floating detector 310 and a second voltage floating detector 320. The first voltage floating detector 310 is configured to detect floating voltages in the voltage domain VDD2 and includes one or multiple inverters 32 coupled in series between an input end and an output end. The second voltage floating detector 320 is configured to detect floating voltages in the voltage domain VDD1 and includes one or multiple inverters 34 coupled in series between an input end and an output end, wherein VDD2 is higher than VDD1. However, the number of voltage domains does not limit the scope of the present application.

In the present invention, the number of inverters 32 adapted in the first voltage floating detector 310 is associated with voltages supplied in the voltage domains VDD1 and VDD2, and can be any positive number. Similarly, the number of inverters 34 adapted in the second voltage floating detector 320 is associated with voltages supplied in the voltage domains VDD1 and VDD2, and can be any positive number. For illustrating purpose, FIG. 5 depicts the embodiment in which each voltage floating detector includes three inverters. However, the structure of the floating detectors 310 and 320 does not limit the scope of the present invention.

In an embodiment, each of the inverters 32 and 34 may include an N-type metal-oxide-semiconductor (NMOS) transistor and a P-type metal-oxide-semiconductor (PMOS) transistor arranged in a complementary-symmetric configuration commonly known as CMOS pair. The transistors of the first voltage floating detector 310 may operate in the voltage domain VDD2, while the transistors of the second voltage floating detector 320 may operate in the voltage domain VDD1. The width/length (W/L) ratio of each transistor in the first inverters 32 may be determined so that the driving power of NMOS transistors is larger than the driving power of PMOS transistors. However, the structure of the floating detectors 310 and 320 does not limit the scope of the present invention.

In the embodiment depicted in FIG. 5, the power floating detector 300 may further include a voltage converter 340 for converting the voltage supplied by the voltage source $VS_2$ into the voltage V2, while the voltage V1 may be directly obtain from the voltage source $VS_1$. However, the method of obtaining the voltage associated with each voltage source does not limit the scope of the present application.

In the embodiment illustrated in FIG. 5, the input end of the first voltage floating detector 310 is coupled to receive the voltage V1 associated with the voltage domain VDD1 and coupled to ground via a resistor $R_{F1}$. When the power supplied in the voltage domain VDD1 is not floating, the input end of the first voltage floating detector 310 is pulled high, thereby generating a logic 0 control signal $S_{FT1}$ at the output end of the first voltage floating detector 310; when the power supplied in the voltage domain VDD1 somehow becomes floating, the input end of the first voltage floating detector 310 is pulled low, thereby generating a logic 1 control signal $S_{FT1}$ at the output end of the first voltage floating detector 310.

In the embodiment illustrated in FIG. 5, the input end of the second voltage floating detector 320 is coupled to receive the voltage V2 associated with the voltage domain VDD2 and coupled to ground via a resistor $R_{F2}$. When the power supplied in the voltage domain VDD2 is not floating, the input end of the second voltage floating detector 320 is pulled high, thereby generating a logic 0 control signal $S_{FT2}$ at the output end of the second voltage floating detector 320; when the power supplied in the voltage domain VDD2 somehow becomes floating, the input end of the second voltage floating detector 320 is pulled low, thereby generating a logic 1 control signal $S_{FT2}$ at the output end of the second voltage floating detector 320.

The logic circuit 330 is configured to generate the floating signal PVDDFT and switch the level of the floating signal PVDDFT according to the control signals $S_{FT1} \sim S_{FT2}$. In an embodiment, the logic circuit 330 may be implemented using a 2-input NOR gate which is configured to generates a logic 1 floating signal PVDDFT when both the control signals $S_{FT1} \sim S_{FT2}$ are at logic 0 level and generate a logic 0 floating signal PVDDFT when any of the control signals $S_{FT1} \sim S_{FT2}$ is at logic 1 level. In other words, a logic 1 floating signal PVDDFT indicates that the power supplied in all voltage domains is not floating, and a logic 0 floating signal PVDDFT indicates that at least the power supplied in one voltage domain is floating.

As previously stated for illustrating purpose, the power floating detector 300 depicted in FIG. 5 includes two voltage domains VDD1 and VDD2 wherein the first voltage floating detector 310 operating in the second voltage domain VDD2 is configured to detect floating voltages in the first voltage domain VDD1 and the second voltage floating detector 320 operating in the first voltage domain VDD1 is configured to detect floating voltages in the second voltage domain VDD2. In another embodiment, the power floating detector 300 may include N voltage domains VDD1~VDDN (N>2) wherein multiple voltage converters and N voltage floating detector are adapted for detecting floating voltages in the N voltage domains VDD1~VDDN, respectively. The N voltage floating detectors may operate in any of the N voltage domains VDD1~VDDN as long as each of the voltages V1~VN is within the suitable input range for proper operation of each voltage floating detector, such as using a corresponding voltage converter. However, the operating voltage domain of the voltage floating detector does not limit the scope of the present invention.

As previously stated for illustrating purpose, the power floating detector 300 depicted in FIG. 5 includes two voltage domains VDD1 and VDD2 wherein the logic circuit 330 may be implemented using a 2-input NOR gate. In another embodiment, the power floating detector 300 may include N voltage domains VDD1~VDDN (N>2) wherein the logic circuit 330 is implemented using an N-input NOR gate. However, the structure of the logic circuit 330 does not limit the scope of the present invention.

Figure 6:
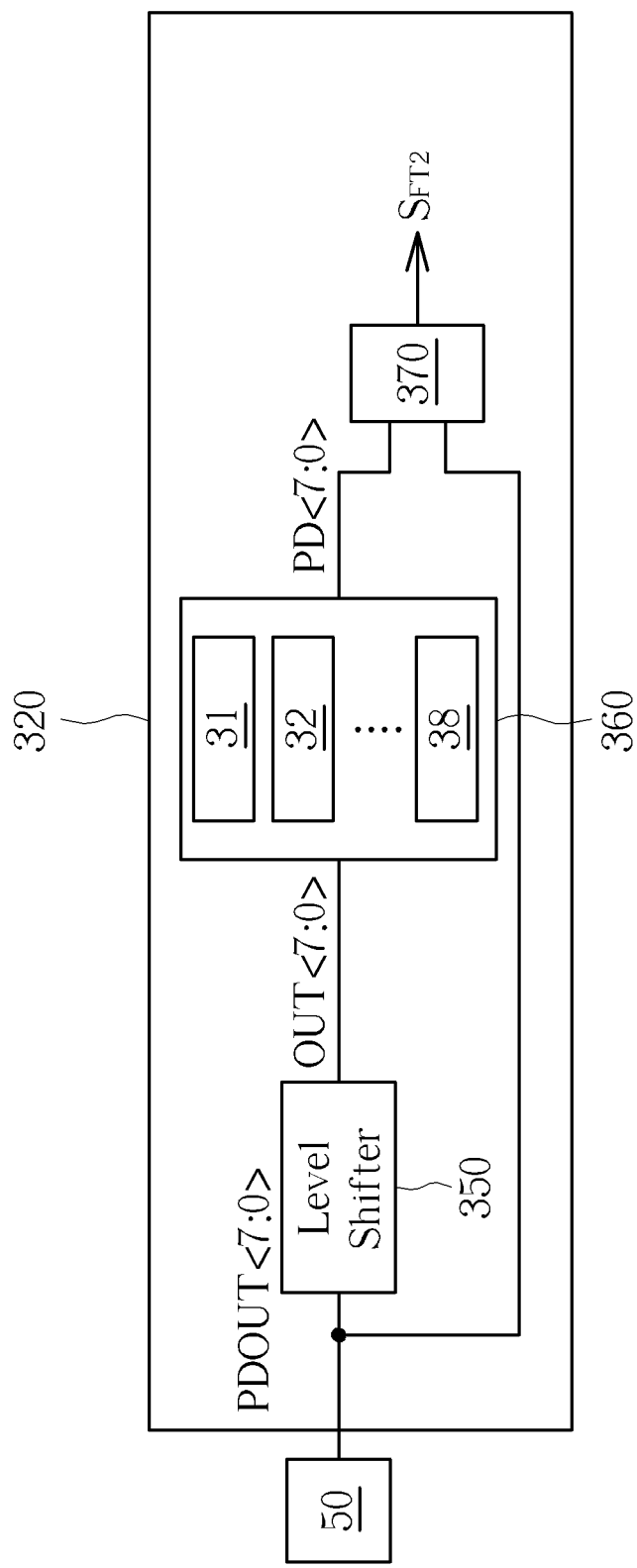
FIG. 6 is a diagram illustrating a circuitry for implementing a power floating detector according to another embodiment of the present invention.

FIG. 6 is a diagram illustrating a circuitry for implementing the second voltage floating detector 320 in the power floating detector 300 according to another embodiment of the present invention. In this embodiment, the second voltage floating detector 320 includes a level shifter 350, an inverting unit 360, and a logic circuit 370. The inverting unit 360 includes multiple inverting stages associated with the input data of the level shifter 350. For illustrative purpose, FIG. 6 depicts the embodiment of N=2 in which the power system 10 operates in two voltage domains VDD1 and VDD2 (VDD2>VDD1) and the inverting unit 360 includes 8 inverting stages 31-38. However, the structure of the inverting unit 360 does not limit the scope of the present invention.

In the embodiment depicted in FIG. 6, the input end of the second voltage floating detector 320 is coupled to receive an input data which may be outputted from a circuit 50 operating in the voltage domain VDD1 of the power system 10. For example, the circuit 50 may be a sensing amplifier in the memory circuit of the power system 10 and the input data may be an 8-bit data represented by PDOUT<7:0>. The level shifter 350 is configured to convert the input data PDOUT<7:0> into an 8-bit data represented by OUT<7:0>. Each inverting stage of the inverting unit 360 may include M inverters (M is 0 or a positive even number) configured to invert the state of the data OUT<7:0>, thereby outputting a corresponding 8-bit data represented by PD<7:0>.

The logic circuit 370 is configured to generate the control signal $S_{FT2}$ and switch the level of the control signal $S_{FT2}$ according the levels of the data PD<7:0> and the data PDOUT<7:0>. If there is a floating voltage occurring in the VDD2 voltage domain, the state of each bit in the data PD<7:0> will not match the state of each corresponding bit in the data PDOUT<7:0>.

In an embodiment, the logic circuit 370 may be implemented using eight 2-input XOR gate which is configured to compare the state of each bit in the data PD<7:0> with the state of each corresponding bit in the data PDOUT<7:0>, thereby generating the control signal $S_{FT2}$. More specifically, the logic circuit 370 is configured to generate a logic 0 control signal $S_{FT2}$ only when PD<7>=PDOUT<7>, PD<6>=PDOUT<6>, PD<5>=PDOUT<5>, PD<4>=PDOUT<4>, PD<3>=PDOUT<3>, PD<2>=PDOUT<2>, PD<1>=PDOUT<1>, and PD<0>=PDOUT<0>. If any of the above conditions does not hold true, the logic circuit 370 is configured to generate a logic 1 control signal $S_{FT2}$. In other words, a logic 0 control signal $S_{FT2}$ indicates that the power supplied in the voltage domain VDD2 is not floating, and a logic 1 control signal $S_{FT2}$ indicates that the power supplied the voltage domain VDD2 is floating.

As previously stated for illustrating purpose, the power floating detector 300 depicted in FIG. 6 includes two voltage domains VDD1 and VDD2 for detecting floating voltages in the second voltage domain VDD2. In another embodiment, the power floating detector 300 may include N voltage domains VDD1~VDDN (N>2). Under such circumstance, the level shifter 350 may shift each bit of the input data PDOUT<N-1:0> to the level of the N voltage domains VDD0~VDDN, respectively. For example, the first bit PDOUT<0> of the input data PDOUT<N-1:0> may be shifted to the voltage domain VDD2 and becomes the first bit OUT<0> of the data OUT<N-1,0>; the second bit PDOUT<1> of the input data PDOUT<N-1:0> may be shifted to the voltage domain VDD3 and becomes the second bit OUT<1> of the data OUT<N-1,0>; ... ; and the $N^{th}$ bit PDOUT<N-1> of the input data PDOUT<N-1:0> may be shifted to the voltage domain VDDN and becomes the $N^{th}$ bit OUT<N-1> of the data OUT<N-1,0>.

In an embodiment, the controller 400 depicted in FIG. 1 may be implemented using a 2-input AND gate which is configured to generate a logic 1 power status signal $S_R$ when both the level signal PLDET and the floating signal PVDDFT are at logic 1 level and generate a logic 0 power status signal $S_R$ when any of the level signal PLDET and the floating signal PVDDFT is at logic 0 level. In other words, a logic 1 power status signal $S_R$ indicates that the power supplied in all voltage domains is within their nominal operational ranges and is not floating, and a logic 0 power status signal $S_R$ indicates that at least the power supplied in one voltage domain exceeds its nominal operational range or is floating. Based on the power status signal $S_R$, a circuit block may be trigger to restart operation or reset the power source 100 in response to voltage deviations or glitch attacks.

In an embodiment, each of the controller 400, the logic circuit 230, the logic circuit 330 and the logic circuit 370 may be implemented as independent circuitry. In another embodiment, the logic circuits 230, 330 and 370 may be integrated in the controller 400. However, the implementation of controller 400, the logic circuit 230, the logic circuit 330 and the logic circuit 370 does not limit the scope of the present application.

The present invention provides a power system with detecting function and multiple voltage domains for different circuit portions. The present power system adopts a power level detector configured to constantly monitor the voltage level of each voltage domain and a power floating detector configured to detect the presence of floating voltages in each voltage domain. This way, when power supplied in a voltage domain somehow exceeds its nominal operational range or becomes floating, a circuit block may be trigger to restart operation or reset the power source. When a transient disturbance occurs in the present power system due to a glitch attack, a circuit block may be trigger to restart operation or reset the power source so as to prevent hardware to be force into an illegitimate state. Therefore, the present power system with detection function can guarantee stable operations and detect glitch attacks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power system with detecting function, comprising:
   a power source comprising:
      a first voltage source for operations in a first voltage domain of the power system; and
      a second voltage source for operations in a second voltage domain of the power system;
   a power level detector comprising:
      a first voltage level detector configured to determine whether a voltage supplied by the first voltage source is within a first nominal operational range associated with the first voltage domain; and
      a second voltage level detector configured to determine whether a voltage supplied by the second voltage source is within a second nominal operational range associated with the second voltage domain;
   a power floating detector comprising:
      a first voltage floating detector configured to determine whether the voltage supplied by the second voltage source is floating; and
      a controller configured to output a power status signal according to a level signal and a floating signal, wherein:
         the power status signal is at a first level when the voltage supplied by the first voltage source exceeds the first nominal operational range, when the voltage supplied by the second voltage source exceeds the second nominal operational range, when the voltage supplied by the first voltage source is floating, or when the voltage supplied by the second voltage source is floating; and
         the power status signal is at a second level when the voltage supplied by the first voltage source is within the first nominal operational range, when the voltage supplied by the second voltage source is within the second nominal operational range, when the voltage supplied by the first voltage source is not floating, and when the voltage supplied by the second voltage source is not floating.

2. The power system of claim 1, wherein:
the first voltage level detector includes:
a first comparator comprising:
a positive input end coupled to receive a first reference voltage associated with a lower limit of the first nominal operational range;
a negative input end coupled to receive a first voltage associated with the voltage supplied by the first voltage source; and
an output end for outputting a first control signal according to a relationship between the first reference voltage and the first voltage;
a second comparator comprising:
a positive input end coupled to receive the first voltage;
a negative input end coupled to receive a second reference voltage associated with an upper limit of the first nominal operational range; and
an output end for outputting a second control signal according to a relationship between the second reference voltage and the first voltage; and
the second voltage level detector includes:
a third comparator comprising:
a positive input end coupled to receive a third reference voltage associated with a lower limit of the second nominal operational range;
a negative input end coupled to receive a second voltage associated with the voltage supplied by the second voltage source; and
an output end for outputting a third control signal according to a relationship between the third reference voltage and the second voltage; and
a fourth comparator comprising:
a positive input end coupled to receive the second voltage;
a negative input end coupled to receive a fourth reference voltage associated with an upper limit of the second nominal operational range; and
an output end for outputting a fourth control signal according to a relationship between the fourth reference voltage and the second voltage.

3. The power system of claim 2, wherein:
the power level detector further comprises a reference voltage generator configured to generate the first reference voltage, the second reference voltage, the third reference voltage and the fourth reference voltage; and
a logic circuit configured to generate the level signal and switch a polarity of the level signal according to the first control signal, the second control signal, the third control signal, and the fourth control signal.

4. The power system of claim 2, wherein the first comparator, the second comparator, the third comparator and the fourth comparator operate in the second voltage domain.

5. The power system of claim 2, further comprising:
a voltage converter configured to convert the voltage supplied by the second voltage source into the second voltage, wherein the voltage supplied by the second voltage source is larger than the voltage supplied by the first voltage source.

6. The power system of claim 1, wherein the power floating detector further comprises:
a second voltage floating detector configured to determine whether the voltage supplied by the first voltage source is floating.

7. The power system of claim 6, wherein:
the first voltage floating detector includes:
an input end coupled to receive a first voltage associated with the voltage supplied by the first voltage source and coupled to a ground via a first resistor;
an output end for outputting a fifth control signal according to a level of the voltage supplied by the first voltage source; and
one or multiple first inverters coupled in series between the input end and the output end of the first voltage floating detector;
the second voltage floating detector includes:
an input end coupled to receive a second voltage associated with the voltage supplied by the second voltage source and coupled to the ground via a second resistor;
an output end for outputting a sixth control signal according to a level of the voltage supplied by the second voltage source; and
one or multiple second inverters coupled in series between the input end and the output end of the second voltage floating detector; and
the power floating detector further comprises a logic circuit configured to generate the floating signal and switch a polarity of the floating signal according to the fifth control signal and the sixth control signal.

8. The power system of claim 7, wherein:
the one or multiple first inverters operate in the second voltage domain; and
the one or multiple second inverters operate in the first voltage domain.

9. The power system of claim 7, further comprising:
a voltage converter configured to convert the voltage supplied by the second voltage source into the second voltage, wherein the voltage supplied by the second voltage source is larger than the voltage supplied by the first voltage source.

10. The power system of claim 7, wherein:
each first inverter includes at least one N-type transistor and at least one P-type transistor arranged in a complementary-symmetric configuration; and
a width/length (W/L) ratio of the at least one N-type transistor and a W/L ratio of the at least one P-type transistor are determined according to the first voltage and the second voltage.

11. The power system of claim 7, wherein a driving power of the at least one N-type transistor is larger than a driving power of the at least one P-type transistor.

12. The power system of claim 1, wherein the first voltage floating detector includes:
a level shifter configured to convert first data received from a circuit operating in the first domain into second data in the second domain;
one or multiple inverters configured to generate third data by inverting a state of the second data; and
a logic circuit configured to generate the level signal and switch a polarity of the level signal according to the first data and the third data.

13. The power system of claim 1, wherein:
the first voltage level detector is further configured to determine whether a first transient disturbance occurs to the voltage supplied by the first voltage source; and
the second voltage level detector is further configured to determine whether a second transient disturbance occurs to the voltage supplied by the second voltage source.

* * * * *